United States Patent
Shi et al.

(10) Patent No.: US 10,333,482 B1
(45) Date of Patent: Jun. 25, 2019

(54) DYNAMIC OUTPUT LEVEL CORRECTION BY MONITORING SPEAKER DISTORTION TO MINIMIZE DISTORTION

(71) Applicant: OmniVision Technologies, Inc., Santa Clara, CA (US)

(72) Inventors: Dong Shi, Singapore (SG); Chung-An Wang, Singapore (SG); Cheng-Lun Hu, Singapore (SG)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/888,035

(22) Filed: Feb. 4, 2018

(51) Int. Cl.
*H03G 3/32* (2006.01)
*H04R 3/04* (2006.01)
*H04R 29/00* (2006.01)

(52) U.S. Cl.
CPC ............. *H03G 3/32* (2013.01); *H04R 3/04* (2013.01); *H04R 29/001* (2013.01)

(58) Field of Classification Search
CPC ........... H03G 3/32; H04R 3/04; H04R 29/001
See application file for complete search history.

(56) References Cited

U.S. PATENT DOCUMENTS

| | | | |
|---|---|---|---|
| 2005/0195993 A1* | 9/2005 | Kwon | H03G 5/165 381/102 |
| 2013/0148822 A1* | 6/2013 | Bithell | H04R 3/04 381/97 |
| 2017/0061982 A1* | 3/2017 | Pakarinen | H03G 5/005 |

* cited by examiner

*Primary Examiner* — Andrew L Sniezek
(74) *Attorney, Agent, or Firm* — Lathrop Gage LLP

(57) ABSTRACT

A speaker system featuring automatic volume adjustment to avoid excess distortion includes a first converter for converting an input signal to an input frequency domain signal; and a second converter for converting a microphone signal to an environmental frequency domain signal. A distortion analyzer receives output of the first and second converter and determines at least one distortion level and provides at least one gain adjustment signal used to control a corrector to adjust gain of a speaker driver. The system performs a method of reducing distortion by automatically adjusting volume in each of a plurality of frequency bands including converting an input signal to a frequency domain input signal; converting a microphone signal to an environmental frequency domain signal; determining a distortion level; generating a gain adjustment signal; and adjusting gain of a signal provided to a speaker driver.

4 Claims, 3 Drawing Sheets

DYNAMIC OUTPUT LEVEL CORRECTION BY MONITORING SPEAKER DISTORTION TO MINIMIZE DISTORTION

BACKGROUND

Many amplifier and speaker systems provide reasonably good quality sound reproduction at volumes below a volume distortion threshold, while providing badly distorted sound at volumes significantly above the volume distortion threshold.

Distortion above the volume distortion threshold may be caused by amplifier clipping or saturation, as well as nonlinearities in the speakers themselves. For example, while many speakers have speaker-cone suspension systems that act like nearly-linear springs for small cone displacements, at large cone displacements return forces are nonlinear, being stronger than would be expected of a linear spring. Other nonlinearities result from changes in inductance as the voice coil moves through the magnetic field of the speaker, and changes in speaker compartment volume as the speaker cone moves. Yet more nonlinearities result from loose or failed glue, rubbing speaker parts, dirt, and other age-related effects.

Speaker housings, which often double as housings for other electronics from cell phones, televisions, computers, or intercoms, may also introduce nonlinearities at high volume as housing parts and housing contents vibrate, including vibrating against each other.

All these nonlinearities in amplifier and speaker result in amplifier-speaker system distortion.

Speaker distortion often includes harmonic distortion, where second and third harmonics of large signals appear. In addition to harmonics, speaker distortion may also include intermodulation products, where a first and second input frequency mix to generate sum and difference frequencies in speaker output. Many people can hear these harmonics and intermodulation products, finding them objectionable and finding they impair speech intelligibility.

Speaker system distortion at high volumes can be reduced by using larger, higher-power, speaker systems with higher distortion thresholds—this raises cost of systems.

Apparent speaker system distortion can also be reduced by use of dynamic compression, where loud signals are detected and volume automatically reduced. Such systems typically require careful engineering of compression parameters for each speaker system, amplifier, and application.

SUMMARY

In an embodiment, a speaker system featuring automatic volume adjustment to avoid excess distortion includes a first converter for converting an input signal to an input frequency domain signal; and a second converter for converting a microphone signal to an environmental frequency domain signal. A distortion analyzer receives output of the first and second converter and determines at least one distortion level and provides at least one gain adjustment signal used to control a corrector to adjust gain of a speaker driver.

In another embodiment, a speaker system performs a method of reducing distortion by automatically adjusting volume in each of a plurality of frequency bands including converting an input signal to a frequency domain input signal; converting a microphone signal to an environmental frequency domain signal; determining a distortion level; generating a gain adjustment signal; and adjusting gain of a signal provided to a speaker driver.

DETAILED DESCRIPTION OF THE EMBODIMENTS

Single Channel Correction

Figure 1:
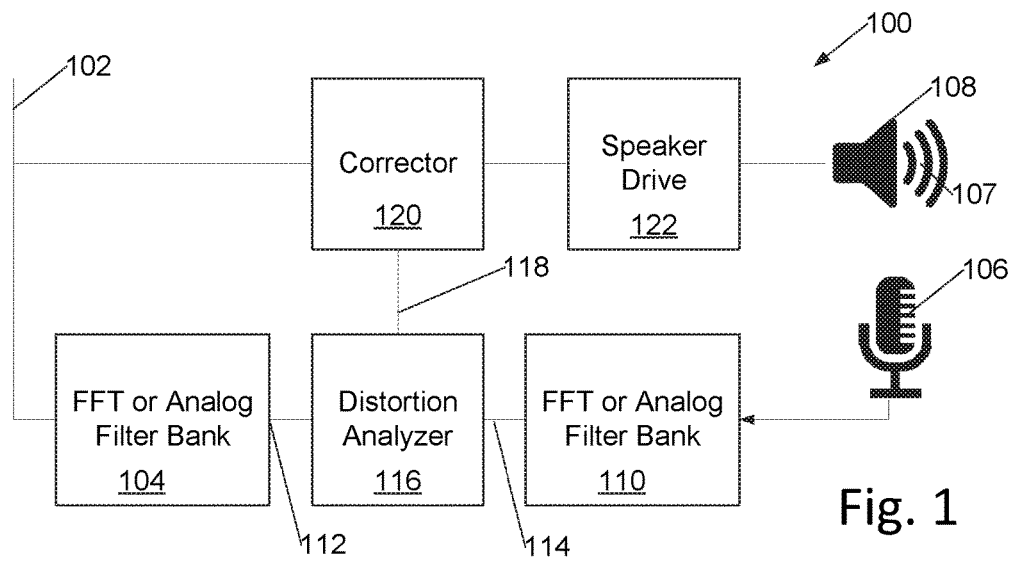
FIG. 1 is a conceptual block diagram of an embodiment of a system for automatically detecting speaker system distortion and adjusting volume accordingly.

A single-channel speaker system 100 with automatic detection and compensation for speaker-system distortion is illustrated in FIG. 1. In this system, an input signal 102 is fed to a frequency-banding and amplitude-detection subsystem, implemented with either a digital time-domain to frequency-domain conversion, or in some embodiments an analog filter bank 104. In particular embodiments, the digital time-domain to frequency-domain conversion is performed by a fast Fourier transform (FFT) unit, a discrete Fourier transform (DFT) unit, or by a discrete cosine transform (DCT), each of which provide a frequency-domain representation of an input signal, A microphone 106 is located to observe sound 107 generated by loudspeaker 108, and coupled to another frequency-banding and amplitude-detection subsystem, also implemented either with a digital FFT, DFT, or DCT unit or analog filter bank 110. Each digital FFT, DFT, or DCT unit or filter bank 104, 110, generates a frequency domain output 112, 114 that includes an amplitude versus frequency distribution map for its respective input signal, the input signal 102 or the microphone 106. The amplitude versus frequency map, or frequency domain, signals 112, 114 are input to a distortion analyzer 116 that determines whether sound 107 generated by loudspeaker 108 has unacceptable distortion, if distortion is unacceptable, distortion analyzer 116 provides an adjustment signal 118 to a corrector 120 that adjusts volume of input signal 102 before amplification in a final amplifier and speaker drive circuit 122 that in turn drives speaker 108.

Distortion analyzer 116 is based on the fact that nonlinear devices, such as amplifiers driven into saturation, and overloaded loudspeakers, produce second, third, and higher harmonics, as well as intermodulation products, all of which may appear in frequency bands where the device input may be silent. A basic distortion analyzer 116 may operate by examining amplitude in frequency bands of both the input amplitude-frequency map 112 and microphone amplitude-frequency map 114. Distortion products can be recognized as present in a frequency band of A frequency when frequency band A of input amplitude-frequency map 112 has negligible or no signal, but the same frequency bands A of output amplitude-frequency map 114 show a significant signal, while one or more of frequency band A/2 at one-half, A/3 at one-third, and/or A/4 at one quarter of frequency A have significant signals. When distortion products in frequency band A are detected, distortion analyzer 116 concludes that whichever or all high volume signals present in the frequency bands A/2, A/3, or A/4 are being distorted.

When distortion analyzer 116 determines that distortion above a threshold is present, distortion analyzer 116 alters adjustment signal 118 to reduce gain in corrector 120, thereby reducing input to speaker driver 122 and reducing amplitude at loudspeaker 108 to reduce distortion.

Multiband Correction

Large signals in one or a few frequency bands can result in considerable distortion across many frequencies, creating objectionable nose and impairing intelligibility of voice signals.

Intelligibility of speech is often maintained despite reduction of volume in some frequency bands. For example, speech having reduced volume at low frequencies, such as below 300 Hz, while retaining full volume at higher frequencies, retains much intelligibility. We propose a loudspeaker system 200 (FIG. 2) that identifies particular frequency bands of speech having high volumes and which cause distortion, then trims volume in those frequency bands while leaving other frequency bands unaltered.

In this system, an input signal 202 is fed to an analog or time domain to frequency domain converter 204 for conversion to a frequency domain input 206, converter 204 performs frequency-banding and amplitude-detection and is typically implemented with an analog-to-digital converter if the signal is analog, and a digital fast Fourier transform (FFT) unit 204, although an analog filter bank may substitute for the FFT in some embodiments. The frequency domain input 206 is fed to a multiband corrector 208 adapted to individually control gain of each frequency band of the frequency-domain input. In an embodiment using an FFT with bandwidth from 80 to 8000 Hz using twelve millisecond FFT timeslices and 24 khz sampling, there may be 288 such frequency bands; in most systems there will be at least 100 frequency bands in the frequency-domain input signal.

Corrector 208 has output 210; corrector output 210 represents the time domain input 206 with gain adjustments applied to some, but not all, frequency bands. Corrector output 210 is fed to a frequency domain to analog domain converter 212, typically incorporating a digital inverse-FFT unit and a digital-to-analog converter, to provide an analog signal to a speaker driver 214 that in turn drives a speaker 216; speaker 216 is a loudspeaker as known in the audio systems art.

A microphone 218 senses audio 220 emitted by speaker 216 into the environment, providing an environmental audio signal 222, that is provided to another analog or time domain to frequency domain converter 224 for conversion to a frequency domain environmental audio signal 226. Both the frequency domain environmental audio signal 226 and corrector output 210 are input to distortion analyzer 228, which provides individual gain adjustment signals 230 to multiband corrector 208.

In this embodiment, it is not sufficient to merely identify that distortion is taking place, it is necessary to identify particular frequency bands of the frequency-domain input signal having large volume signals that that provoke the distortion so those bands can be adjusted, while leaving other bands unaltered.

Figure 3:
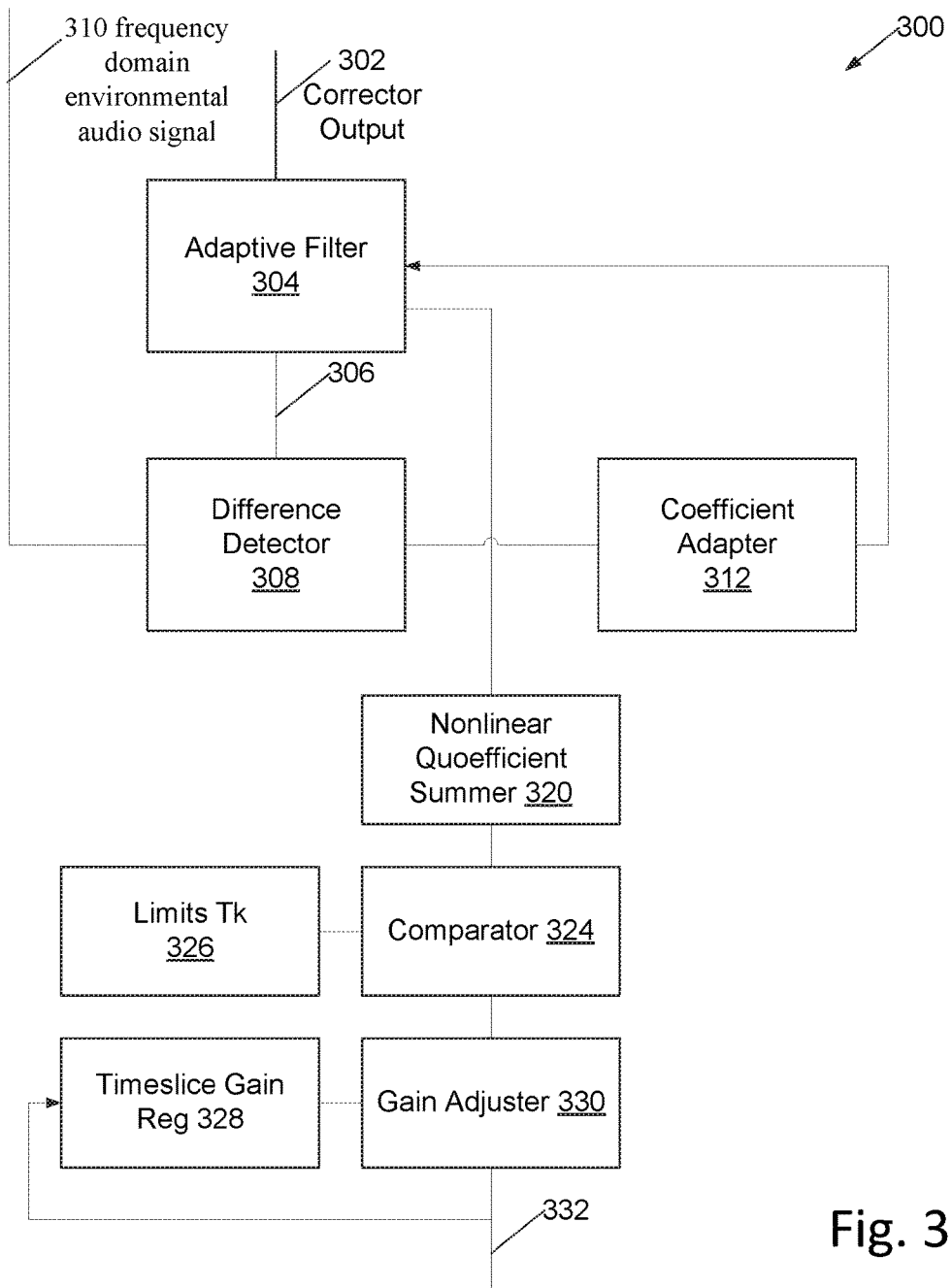
FIG. 3 is a conceptual block diagram of a distortion analyzer for use with multichannel volume correction, as illustrated in FIG. 2

In order to analyze distortion and determine appropriate corrections, in our distortion analyzer 228, 300 (FIG. 3), we construct, in the same digital signal processor that performs the FFT and inverse FFT functions, a model of the speaker driver 214, speaker 216, and path for audio 220 to microphone 218, using an adaptive filter 304. The corrector output 210, 302 is input to adaptive filter 304, and adaptive filter output 306 for each timeslice is compared in a least-squares difference detector 308 to the frequency domain environmental audio signal 310, 226. Least squares output of the difference detector 308 is fed to a coefficient adapter 312 that adjusts coefficients of adaptive filter 304 to minimize the least squares output of the difference detector 308 in each timeslice and thereby fit the adaptive filter's coefficients so that it correctly models distortion of the speaker driver 214, speaker 216, and path for audio 220 to microphone 218.

The adaptive filter includes nonlinear terms and includes a multiplicity of multipliers each of which multiplies a coefficient of the adaptive filter by a term derived from an input or delayed input of the adaptive filter.

In a particular embodiment, the adaptive filter implements $$\hat{s}_r(n,qk) = h_{qk}^H(n,k) s_o(n,k), \qquad (1)$$

where q=2, 3, . . . represents the q-th harmonics, q=1 represents each fundamental frequency band $$h_{qk}(n,k) = [h_{qk}(n,k), h_{qk}(n-1,k), \ldots h_{qk}(n-P,k)]^T \qquad (2)$$

is a vector containing the coefficients of the adaptive filter of order P.

$s_o(n,k) = [s_o(n,k) s_o(n-1,k), \ldots s_o(n-P,k)]^T$ is history of the output audio, and $h^H$ denotes the conjugate transpose of vector h.

Once fitting is complete for each timeslice, we extract the nonlinear coefficients from the adaptive filter, then sum, in nonlinear coefficient summer 320, the power of the coefficients of the adaptive filter for all the harmonic distortion components for the each k-th frequency band:

$$D_k(n) = \sum_{i=2}^{Q} \left| \sum_{j=0}^{P} |h_{ik}(n-j,k)|^2 \right|^2$$

For calculating harmonic distortion, the fundamental frequency band is ignored, so that i starts from 2. Typically, Q ranges from 2 to 5 and the harmonic distortion from 6 onwards are usually rather small and negligible.

Once fit, the distortion terms for each frequency band k are compared in comparator 324 to limits $T_k$ 326 to identify frequency bands k responsible for distortion in the speaker system. A prior timeslice gain setting $g_k(n)$ 328 in a timeslice gain register 328 for each band k is decreased in gain adjuster 330 to provide a next-timeslice gain setting $g_k(n+1)$ 332, 230, whenever the corresponding distortion term $D_k$ exceeds the allowable distortion threshold for that band $T_k$, 326. This gain register, after adjustment, is used to control gain of corresponding bands in multiband corrector 208 for the next timeslice. In one particular embodiment the gain setting g(k) is reduced by a constant for each timeslice in which distortion term $D_k$ exceeded the allowable distortion threshold for that band $T_k$, in another dynamic-gain adjustment embodiment the gain setting g(k) is reduced by an amount $$\frac{1}{\sqrt{1 + C_k D_k(n) P_k(n)}} \qquad (4)$$

where $P_k$ (n) is the instantaneous power of the k-th input audio band. The gain of this embodiment curbs down signals with large power as $P_k(n)$ increases. Similarly, it also decreases as $D_k$ (n) gets larger, meaning high nonlinearities. The constant $C_k$ is a predefined constant. It is used to scale the product of $D_k(n)$ and $P_k(n)$ to a comparable level to 1 when the k-th input audio band gets closer to the maximum value of the dynamic range.

In both the constant-gain-decrease on a frequency band causing distortion greater than the threshold, and the dynamic gain adjustment embodiment, gain adjuster 330 adds a small return factor to each gain of g(k) less than a standard gain $G_s$ to bleed the adjusted gains back to standard gain over a restoration time, restoration time is typically at least several seconds to minutes. In an alternative faster-responding embodiment, a smoothing factor is applied to Dk(n) instead of using the return factor to bleed gain back to standard gain.

Figure 2:
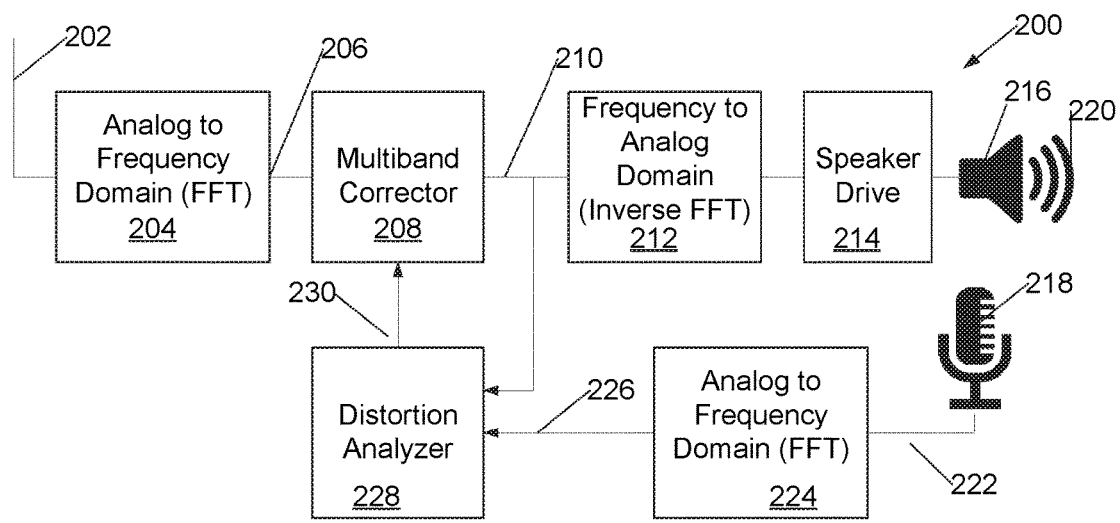
FIG. 2 is a conceptual block diagram of an embodiment of a system for automatically detecting speaker system distortion and adjusting volume in particular volume bands accordingly.
Figure 4:
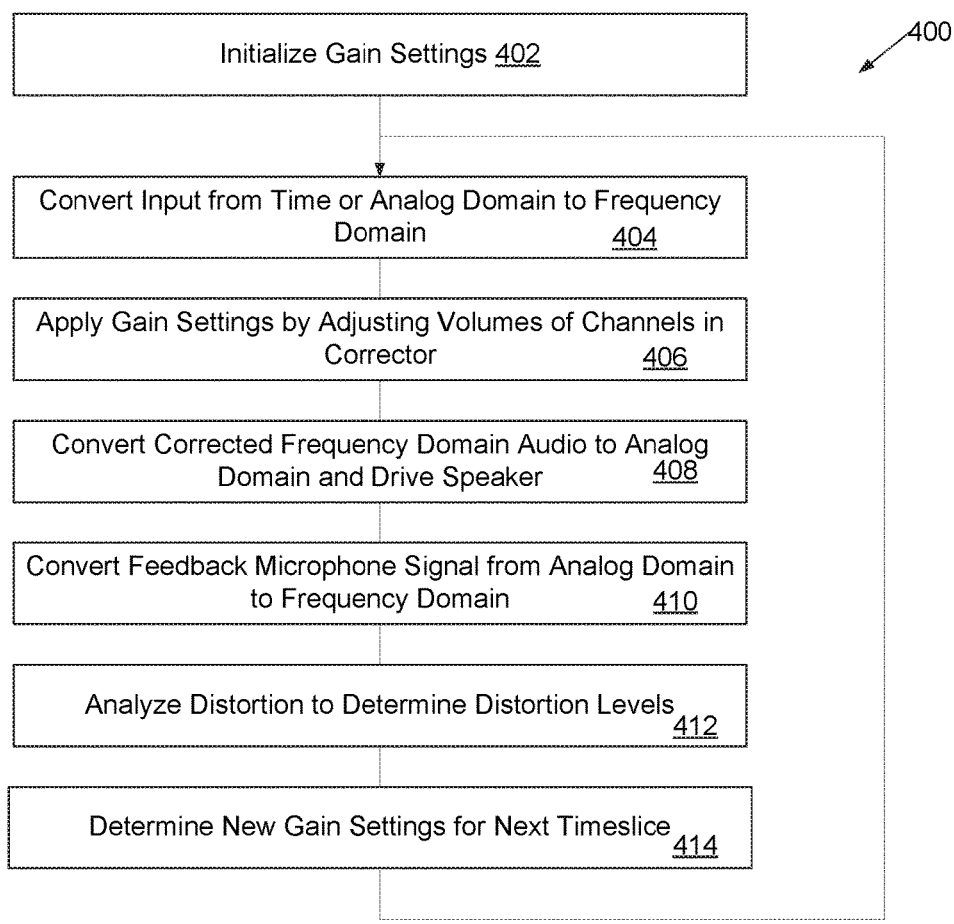
FIG. 4 is a flowchart illustrating operation of the system.

The system described with reference to FIG. 2 applies the method 400 illustrated in FIG. 4.

At system startup, gain settings for each channel are initialized 402, in an embodiment to initialization constants such as unity, and in another embodiment to a last gain used prior to system shutdown. An input signal 202 is converted 404 from time or analog domain to frequency domain, and the gain settings are applied 406 in corrector 208 to provide a corrected audio 210 in frequency domain. The corrected audio 210 is converted 408 to analog domain and used to drive a speaker 216.

Audio from speaker 216 is received by a feedback microphone 218 and converted 410 to frequency domain. The corrected audio 210 and frequency domain microphone audio and analyzed 412 to determine distortion levels, these distortion levels are used to determine 414 new gain settings for the next timeslice. The method repeats with converting 404 more input from time or analog domain to frequency domain.

Combinations

Features of the automatic distortion-reducing speaker system described herein may be combined in multiple ways as described in the claims that follow and in the following proposed combinations:

A speaker system designated A featuring automatic volume adjustment to avoid excess distortion includes a first converter adapted to convert an input signal to an input frequency domain signal; a second converter adapted to convert a microphone signal to an environmental frequency domain signal; a distortion analyzer coupled to receive the input frequency domain signal and the environmental frequency domain signal, the distortion analyzer configured to determine at least one distortion level and to provide at least one gain adjustment signal; and a corrector adapted to control gain of a signal provided to a speaker driver coupled to drive a speaker.

A speaker system designated AA including the speaker system designated A wherein the at least one distortion level is a plurality of distortion levels, each distortion level corresponding to distortion in a different frequency band of a plurality of frequency bands, and the at least one gain adjustment signal being a plurality of gain adjustment signals each coupled to control gain of a frequency band of the signal provided to the speaker driver.

A speaker system designated AB including the speaker system designated A or AA wherein the first and second converter perform a fast Fourier transform (FFT), an output of the first converter is coupled as an input to the corrector, and the corrector is coupled to the speaker driver through an inverse-Fourier transform (I-FFT).

A speaker system designated AC including the speaker system designated A, AA or AB wherein the distortion analyzer comprises an adaptive filter coupled to receive an output of the corrector, the adaptive filter being configured by coefficients, the adaptive filter coefficients repeatedly fit to provide adaptive filter output close to the environmental frequency domain signal.

A speaker system designated AD including the speaker system designated A, AA, AB, or AC, wherein the at least one distortion level is determined from the adaptive filter coefficients after the adaptive filter coefficients are fit to the environmental frequency domain signal, and wherein the gain adjustment signals are adjusted according to the at least one distortion level.

A method designated B of reducing speaker system distortion by automatically adjusting volume in each of a plurality of frequency bands includes converting an input signal to a frequency domain input signal; converting a microphone signal to an environmental frequency domain signal; determining at least one distortion level; generating at least one gain adjustment signal; and controlling gain of a signal provided to a speaker driver coupled to drive a speaker.

A method designated BA including the method designated B; wherein the at least one distortion level is a plurality of distortion levels, each distortion level of the plurality of distortion levels corresponding to distortion in a different frequency band of a plurality of frequency bands, and the at least one gain adjustment signal being a plurality of gain adjustment signals each coupled to control gain of a frequency band of the signal provided to the speaker driver.

A method designated BB including the method designated B or BA wherein the converting an input signal to a frequency domain input signal and the converting a microphone signal to an environmental frequency domain signal are performed by performing a fast Fourier transform (FFT).

A method designated BC including the method designated B, BA, or BB wherein the step of determining at least one distortion level comprises fitting coefficients of an adaptive filter repeatedly to provide adaptive filter output close to the environmental frequency domain signal.

A method designated BD including the method designated B, BA, BB, or BC wherein determining at least one distortion level further comprises determining the at least one distortion level from the adaptive filter coefficients, and wherein at least one gain is adjusted according to the at least one distortion level.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A speaker system featuring automatic volume adjustment to avoid excess distortion comprising:
    a first converter adapted to convert an input signal to an input frequency domain signal;
    a second converter adapted to convert a microphone signal to an environmental frequency domain signal;
    a distortion analyzer coupled to receive the input frequency domain signal and the environmental frequency domain signal, the distortion analyzer configured to determine at least one distortion level and to provide at least one gain adjustment signal; and
    a corrector adapted to control gain of a signal provided to a speaker driver coupled to drive a speaker according to the at least one gain adjustment signal;

wherein the at least one distortion level is a plurality of distortion levels, each distortion level corresponding to distortion in a different frequency band of a plurality of frequency bands, and the at least one gain adjustment signal being a plurality of gain adjustment signals each coupled to control gain of a frequency band of the signal provided to the speaker driver; the first and second converter perform a fast Fourier transform (FFT), an output of the first converter is coupled as an input to the corrector, and the corrector is coupled to the speaker driver through an inverse-Fourier transform (I-FFT); and the distortion analyzer comprises an adaptive filter coupled to receive an output of the corrector, the adaptive filter being configured by coefficients, the adaptive filter coefficients repeatedly fit to provide adaptive filter output close to the environmental frequency domain signal.

2. The speaker system of claim 1 wherein the at least one distortion level is determined from the adaptive filter coefficients after the adaptive filter coefficients are fit to the environmental frequency domain signal, and wherein the gain adjustment signals are adjusted according to the at least one distortion level.

3. A method of reducing speaker system distortion by automatically adjusting volume in each of a plurality of frequency bands comprising:

converting an input signal to a frequency domain input signal;

converting a microphone signal to an environmental frequency domain signal;

determining a plurality of distortion levels, each distortion level of the plurality of distortion levels corresponding to distortion in a different frequency band of a plurality of frequency bands;

generating a plurality of gain adjustment signals each coupled to control gain of a frequency band of a signal provided to a speaker driver coupled to drive a speaker; and wherein the converting an input signal to a frequency domain input signal and the converting a microphone signal to an environmental frequency domain signal are performed by performing a fast Fourier transform (FFT), and the step of determining at least one distortion level comprises fitting coefficients of an adaptive filter repeatedly to provide adaptive filter output close to the environmental frequency domain signal.

4. The method of claim 3 wherein determining at least one distortion level further comprises determining the at least one distortion level from the adaptive filter coefficients, and wherein at least one gain is adjusted according to the at least one distortion level.

* * * * *